US008085103B2

(12) United States Patent
Athas

(10) Patent No.: US 8,085,103 B2
(45) Date of Patent: Dec. 27, 2011

(54) RESONANT OSCILLATOR CIRCUIT WITH REDUCED STARTUP TRANSIENTS

(75) Inventor: William C. Athas, San Jose, CA (US)

(73) Assignee: Apple Inc., Cupertino, CA (US)

( * ) Notice: Subject to any disclaimer, the term of this patent is extended or adjusted under 35 U.S.C. 154(b) by 86 days.

(21) Appl. No.: 12/629,370

(22) Filed: Dec. 2, 2009

(65) Prior Publication Data
US 2011/0032043 A1 Feb. 10, 2011

Related U.S. Application Data

(63) Continuation-in-part of application No. 12/540,578, filed on Aug. 13, 2009, now Pat. No. 7,982,548, which is a continuation-in-part of application No. 12/535,974, filed on Aug. 5, 2009.

(51) Int. Cl.
*H03K 3/282* (2006.01)
(52) U.S. Cl. .......... 331/117 R; 331/108 A; 331/117 FE; 331/167; 331/172; 331/185
(58) Field of Classification Search ............. 331/108 A, 331/117 R, 117 FE, 167, 172, 185
See application file for complete search history.

(56) References Cited

U.S. PATENT DOCUMENTS

| 5,051,881 | A |   | 9/1991  | Herold  |         |
|-----------|---|---|---------|---------|---------|
| 5,396,195 | A | * | 3/1995  | Gabara  | 331/113 R |
| 5,475,345 | A | * | 12/1995 | Gabara  | 331/117 FE |
| 5,559,478 | A |   | 9/1996  | Athas   |         |
| 5,677,077 | A |   | 10/1997 | Faulk   |         |
| 5,684,682 | A |   | 11/1997 | Zhong   |         |
| 5,760,637 | A |   | 6/1998  | Wong    |         |
| 6,169,673 | B1 |  | 1/2001  | McIntyre |        |
| 6,188,590 | B1 |  | 2/2001  | Chang   |         |
| 6,559,689 | B1 |  | 5/2003  | Clark   |         |
| 6,650,163 | B1 |  | 11/2003 | Burns   |         |
| 6,650,555 | B2 |  | 11/2003 | Suzuki  |         |
| 6,738,271 | B2 |  | 5/2004  | Umeda   |         |

(Continued)

FOREIGN PATENT DOCUMENTS

GB 2374952 A 10/2002

(Continued)

OTHER PUBLICATIONS

Athas, W.C. et al., "A Resonant Signal Driver for Two-Phase, Almost-Non-Overlapping Clocks", pp. 129-132, 1996.
Lenoir, Eric "Getting the Most out of Ceramic Capacitors", pp. 1-6, Aug. 1, 2003.

*Primary Examiner* — Joseph Chang
*Assistant Examiner* — Richard Tan
(74) *Attorney, Agent, or Firm* — Park, Vaughan, Fleming & Dowler LLP

(57) ABSTRACT

Some embodiments of the present invention provide a system that implements a resonant oscillator circuit. This resonant oscillator circuit includes: a first inductor, a second inductor, a first capacitance, and a second capacitance, wherein the first and second inductors are configured to operate with the first and second capacitances to produce resonant oscillations which appear at a first phase output and a second phase output. The system also includes a startup circuit which is configured to start the resonant oscillator circuit in a state where: the first phase output is at a peak voltage; the second phase output is at a base voltage; and currents through the first and second inductors are substantially zero. By starting the resonant oscillator circuit in this state, the oscillations commence without a significant startup transient.

23 Claims, 8 Drawing Sheets

U.S. PATENT DOCUMENTS

| | | |
|---|---|---|
| 2002/0041503 A1 | 4/2002 | Roohparvar |
| 2004/0196095 A1 | 10/2004 | Nonaka |
| 2006/0197583 A1 | 9/2006 | Yen |
| 2006/0290388 A1 | 12/2006 | Tolle |
| 2009/0167418 A1 | 7/2009 | Roghavan |

FOREIGN PATENT DOCUMENTS

| | | |
|---|---|---|
| WO | 02061930 A1 | 8/2002 |
| WO | 2006078244 A1 | 7/2006 |
| WO | 2009136369 A2 | 5/2008 |

* cited by examiner

RESONANT OSCILLATOR CIRCUIT WITH REDUCED STARTUP TRANSIENTS

RELATED APPLICATIONS

This application is a continuation-in-part of pending U.S. patent application Ser. No. 12/540,578, entitled "Resonant Oscillator with Oscillation-Startup Circuitry," filed on 13 Aug. 2009 by inventor William C. Athas. This parent application is itself a continuation-in-part of pending U.S. patent application Ser. No. 12/535,974, entitled "High-Efficiency Switched-Capacitor Power Conversion," filed on 5 Aug. 2009 by inventors William C. Athas and P. Jeffrey Ungar. The present application hereby claims priority under 35 U.S.C. §120 to the two above-listed applications.

FIELD

The disclosed embodiments generally relate to oscillator circuits. More specifically, the disclosed embodiments relate to a method and an apparatus for starting up a resonant oscillator circuit in a manner that reduces startup transients.

RELATED ART

Oscillator circuits are commonly used to generate pulses in electrical systems. However, commonly used oscillator circuits can consume a significant amount of power, which is a disadvantage for systems that need to conserve power, such as portable computing devices. To solve this problem, "resonant oscillator circuits," which transfer energy back and forth between inductive and capacitive circuit elements, can be used to generate clock pulses without dissipating a significant amount of power. (For example, see U.S. Pat. No. 5,559,478, entitled "Highly Efficient, Complementary, Resonant Pulse Generation," by inventor William C. Athas, filed 17 Jul. 1995.)

Unfortunately, existing designs for resonant oscillator circuits are not well suited for certain applications. For example, in one application a resonant oscillator circuit is used to clock the two phases of a switched capacitor block (SCB) in a voltage-conversion system. (See patent application Ser. No. 12/535,974, entitled "High-Efficiency Switched-Capacitor Power Conversion," filed on 5 Aug. 2009 by inventors William C. Athas and P. Jeffrey Ungar which is hereby incorporated by reference).

In this application, problems can arise because of the uncontrolled and unpredictable way in which oscillations commence in a resonant oscillator circuit during power up. For example, as power is applied to the basic two-FET and two-inductor implementation disclosed in U.S. patent application Ser. No. 12/535,974 (cited above), current more or less equally divides between the two inductor branches. Eventually, asymmetries in the component values and the layout will cause the two branch currents to become unequal which allows the oscillations to commence. However, the circuit may exist in a balanced, metastable state for an indeterminate period of time. During this time, current builds up in each inductor in proportion to the duration of the metastable state. Consequently, when the circuit eventually exits the metastable state, the initial output pulses can be almost unbounded in magnitude, and may damage downstream components, such as the SCBs, or even the components of the resonant oscillator circuit itself.

Additionally, as the circuit exits the metastable state, the initial transient oscillations are often weak and highly irregular. This can cause delay and other problems in systems which are clocked using such resonant oscillator circuits.

Hence, what is needed is a resonant oscillator circuit, which does not suffer from the above-listed problems.

SUMMARY

Some embodiments of the present invention provide a system that implements a resonant oscillator circuit. This resonant oscillator circuit includes: a first inductor, a second inductor, a first capacitance, and a second capacitance, wherein the first and second inductors are configured to operate with the first and second capacitances to produce resonant oscillations which appear at a first phase output and a second phase output. The system also includes a startup circuit which is configured to start the resonant oscillator circuit in a state where: the first phase output is at a peak voltage; the second phase output is at a base voltage; and currents through the first and second inductors are substantially zero. By starting the resonant oscillator circuit in this state, the oscillations commence without a significant startup transient.

In some embodiments, the first inductor includes a constant potential terminal coupled to an input voltage and a time-varying potential terminal coupled to the first phase output. Similarly, the second inductor includes a constant potential terminal coupled to the input voltage and a time-varying potential terminal coupled to the second phase output. Moreover, the resonant oscillator circuit also includes a first n-type transistor with a source terminal coupled to a base voltage, a drain terminal coupled to the first phase output, and a gate terminal coupled to the second phase output. The resonant oscillator circuit additionally includes a second n-type transistor with a source terminal coupled to the base voltage, a drain terminal coupled to the second phase output, and a gate terminal coupled to the first phase output. In these embodiments, the first capacitance includes capacitive components from a load on the first phase output and the gate terminal of the second n-type transistor, and the second capacitance includes capacitive components from a load on the second phase output and the gate terminal of the first n-type transistor.

In some embodiments, the startup circuit is configured to initially charge the first capacitance so that first phase output is at the peak voltage prior to starting the resonant oscillator circuit.

In some embodiments, the startup circuit is additionally configured to apply the input voltage to the constant-potential terminals of the first and second inductors prior to starting the resonant oscillator circuit.

In some embodiments, the system includes a buck converter configured to apply the input voltage to the constant-potential terminals of the first and second inductors.

In some embodiments, the startup circuit includes a microcontroller, which sequences operations involved in applying the input voltage to the first and second inductors, and in initially charging the first capacitance.

In some embodiments, the startup circuit additionally includes a bootstrap circuit configured to produce a pulse voltage which is higher than the output voltage of the microcontroller, wherein the pulse voltage can be used to control the initial charging of the first capacitance.

In some embodiments, the system also includes an envelope-generation circuit coupled between the input voltage and the resonant oscillator circuit, wherein the envelope-generation circuit is configured to ramp up the input voltage across multiple oscillation periods when the resonant oscillator circuit starts up.

In some embodiments, the startup circuit additionally includes a third n-type transistor with a source terminal coupled to a base voltage, a drain terminal coupled to the first phase output, and a gate terminal coupled to the second phase output. It also includes a fourth n-type transistor with a source terminal coupled to the base voltage, a drain terminal coupled to the second phase output, and a gate terminal coupled to the first phase output. In these embodiments, the third and fourth n-type transistors have lower threshold voltages than the first and second n-type transistors. This allows oscillations to commence at lower input voltages.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing code and/or data now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Figure 1A:
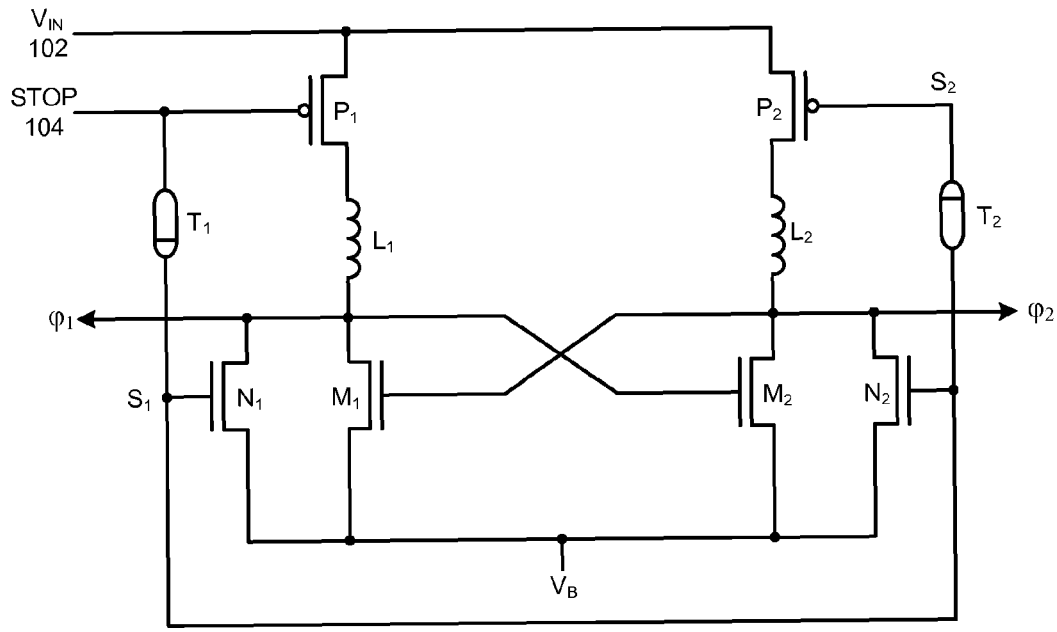
FIG. 1A illustrates a resonant oscillator circuit in accordance with an embodiment of the present invention.
Figure 1B:
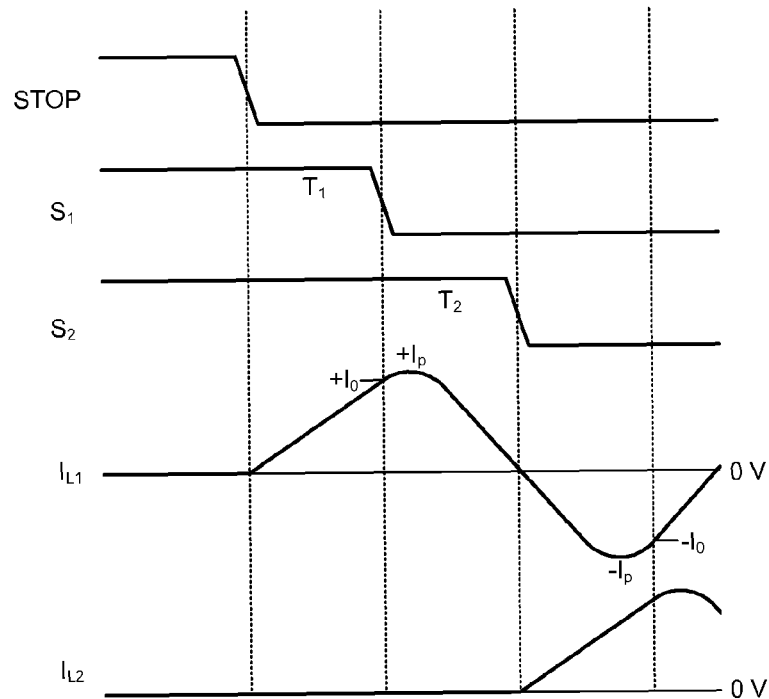
FIG. 1B presents a timing diagram for the control signals in FIG. 1A in accordance with an embodiment of the present invention.
Figure 2:
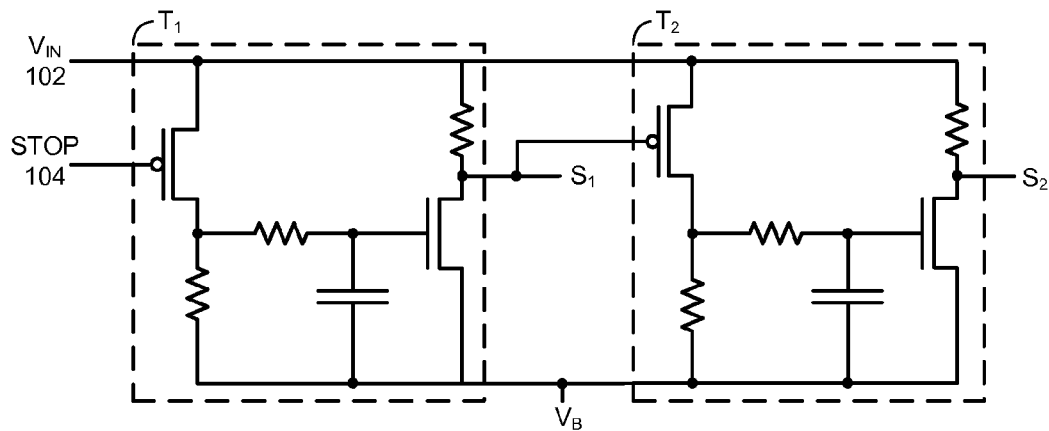
FIG. 2 illustrates a circuit for generating the control signals in FIG. 1A in accordance with an embodiment of the present invention.

This disclosure describes four implementations which solve the above-described problems with different trade-offs in complexity, cost, and oscillator efficiency. The first is shown in FIG. 1A. This implementation includes two p-type transistors, $P_1$ and $P_2$, which are coupled in series to the inductors $L_1$ and $L_2$, respectively. Moreover, the implementation includes two pull-down n-type transistors, $N_1$ and $N_2$, which are attached to each clock output: ($\phi_1$ and $\phi_2$. Note that delay circuits $T_1$ and $T_2$ provide time delays to produce control signals $S_1$ and $S_2$ which starts currents $I_{L1}$ and $I_{L2}$ flowing through inductors $L_1$ and $L_2$, respectively, as is illustrated by the timing diagram which appears in FIG. 1B. Delay circuits $T_1$ and $T_2$ may be implemented as simple passive RC sections, or as more sophisticated active arrangements with current mirrors, inverters, etc. For example, $T_1$ and $T_2$ can be implemented using the circuit illustrated in FIG. 2, which produces control signals $S_1$ and $S_2$ from STOP signal 104.

Each delay is of duration $(1/2)(\pi+\phi)\sqrt{LC}$ where $L=L_1=L_2$ and wherein C is the balanced clocked capacitance per output. Initially, when STOP signal 104 is high, transistors $N_1$ and $N_2$ actively pull down both clock outputs, $\phi_1$ and $\phi_2$, and no current flows through the circuit because transistors $P_1$ and $P_2$ are turned off. When STOP signal 104 subsequently goes low, $P_1$ turns on and $L_1$ starts energizing. It will build up a current starting from zero and ramping linearly up to a normal level $+I_0$. At this point, $S_1$ goes low and $N_1$ and $N_2$ turn off. Note that transistor $N_1$ allows the normal blip pulse to emit on ($\phi_1$, while $\phi_2$ will be held low by transistor $M_2$ of the blip circuit. After a delay $T_2$, transistor $P_2$ turns on and $L_2$ begins to energize for a half cycle starting from zero current. $L_2$ will then emit a normal blip pulse and the circuit will operate normally with $P_1$ and $P_2$ on and $N_1$ and $N_2$ off. When STOP signal 104 goes high, power is cut from the two inductors $L_1$ and $L_2$ and transistors $N_1$ and $N_2$ will clamp the two clock outputs ($\phi_1$ and $\phi_2$ low. Note that the delays $T_1$ and $T_2$ may be implemented by other means such as general-purpose inputs and outputs (GPIOs) from a microcontroller.

Figure 3:
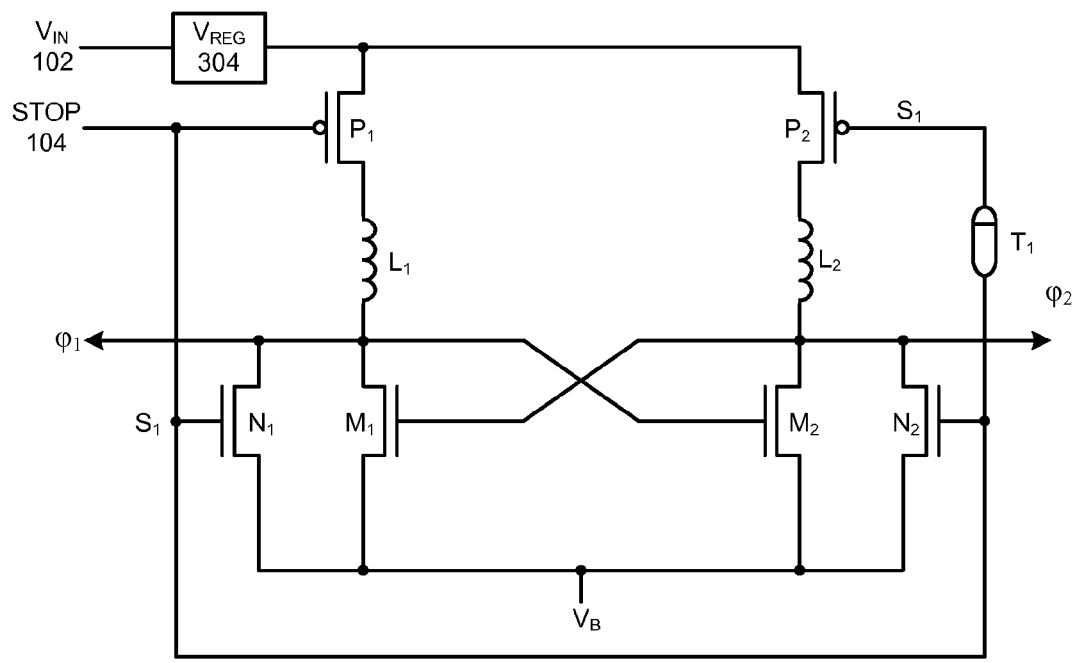
FIG. 3 illustrates an alternative design for a resonant oscillator circuit in accordance with an embodiment of the present invention.

The implementation illustrated in FIG. 1A is advantageous in that the two clocks are cleanly started at the correct amplitude. Also note that one delay $T_2$ may be eliminated at the expense of a higher than normal initial $\phi_2$ blip pulse. FIG. 3 illustrates this alternative embodiment. In FIG. 3, STOP signal 104 is tied directly to the gate inputs of transistors $P_1$ and $N_1$ and $N_2$. When STOP signal 104 subsequently goes low, current flows through $L_1$ to the output.

The pulse width will be $2\pi\sqrt{LC}$ and of lower amplitude than the standard blip waveform, e.g., twice that of $V_{IN}$ 102. The inductor $L_2$, however, now energizes for a much longer period and will produce a much higher pulse level. The effect of this higher pulse level can be mitigated by inserting a voltage regulator $V_{REG}$ 304 between the input voltage and the resonant oscillator circuit as shown in FIG. 3. Initially, the output voltage of $V_{REG}$ 304 is set to a minimum level. The voltage is then ramped up to a normal operating voltage. As before, when STOP signal 104 goes high, power is cut to inductors $L_1$ and $L_2$, and the two clock outputs ($\phi_1$ and $\phi_2$ are clamped low. A drawback of the implementations in FIG. 1A and FIG. 3 is that the p-type transistors, $P_1$ and $P_2$, are in series with the inductors. This arrangement is a source of additional cost and $I^2R_{on}$ loss.

Figure 4:
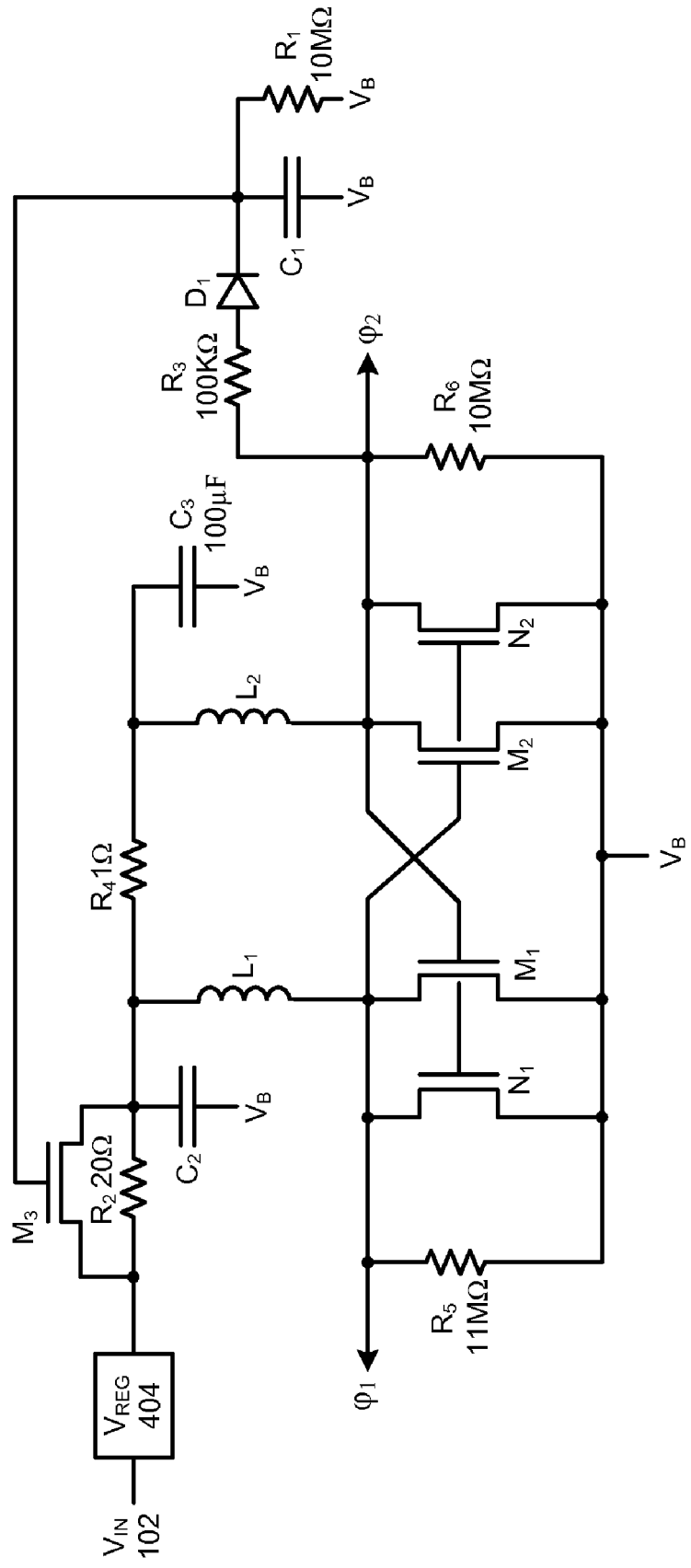
FIG. 4 illustrates another design for a resonant oscillator circuit in accordance with an embodiment of the present invention.

FIG. 4 illustrates another embodiment, which includes a "slow ramp on" feature for SCB inrush protection and a different approach to ensuring that the inductors energize sequentially with reasonable initial amplitudes. This embodiment includes a programmable voltage regulator $V_{REG}$ 404 that starts the oscillator at the lowest feasible voltage and increases to a higher voltage for normal operation under external control. Specially selected low-threshold n-type transistors, $N_1$ and $N_2$, help to lower the minimum startup voltage while exhibiting higher dissipation due to their higher on-resistance characteristics. Transistors $N_1$ and $N_2$ are placed in parallel with low on-resistance but higher threshold voltage power MOSFETS, $M_1$ and $M_2$.

Initially, $M_3$ is off when voltage regulator 404 is powered up. Current first flows to the two inductors $L_1$ and $L_2$ and capacitor $C_2$ through resistor $R_2$. The resistor $R_2$ limits the current flow and there is an exponential rise in voltage at the top side of each inductor. The voltage applied to the second inductor, $L_2$, is delayed by an additional R and C element. Note that the two low-threshold n-type transistors $N_1$ and $N_2$ will start the oscillation. As the oscillation voltage amplitude rises, the diode $D_1$ forward biases and begins to charge-up the capacitor $C_1$ which is tied to the gate of $M_3$. The steady-state amplitude of the oscillator output is approximately 3.2 times that of the input voltage. Hence, $M_3$ will be fully turned on (low on-resistance) during normal operation. Note that the impedance of $R_5$ is 11MΩ, whereas the impedance of resistor $R_6$ is 10MΩ. This asymmetry in resistors $R_5$ and $R_6$ is provided to further assist the startup process by reducing the impedance of the $L_1$ branch relative to the $L_2$ branch. Moreover, the 10MΩ resistor $R_6$, which is tied across capacitor $C_1$, ensures that $M_3$ will turn off when $V_{IN}$ 102 powers down.

Figure 5A:
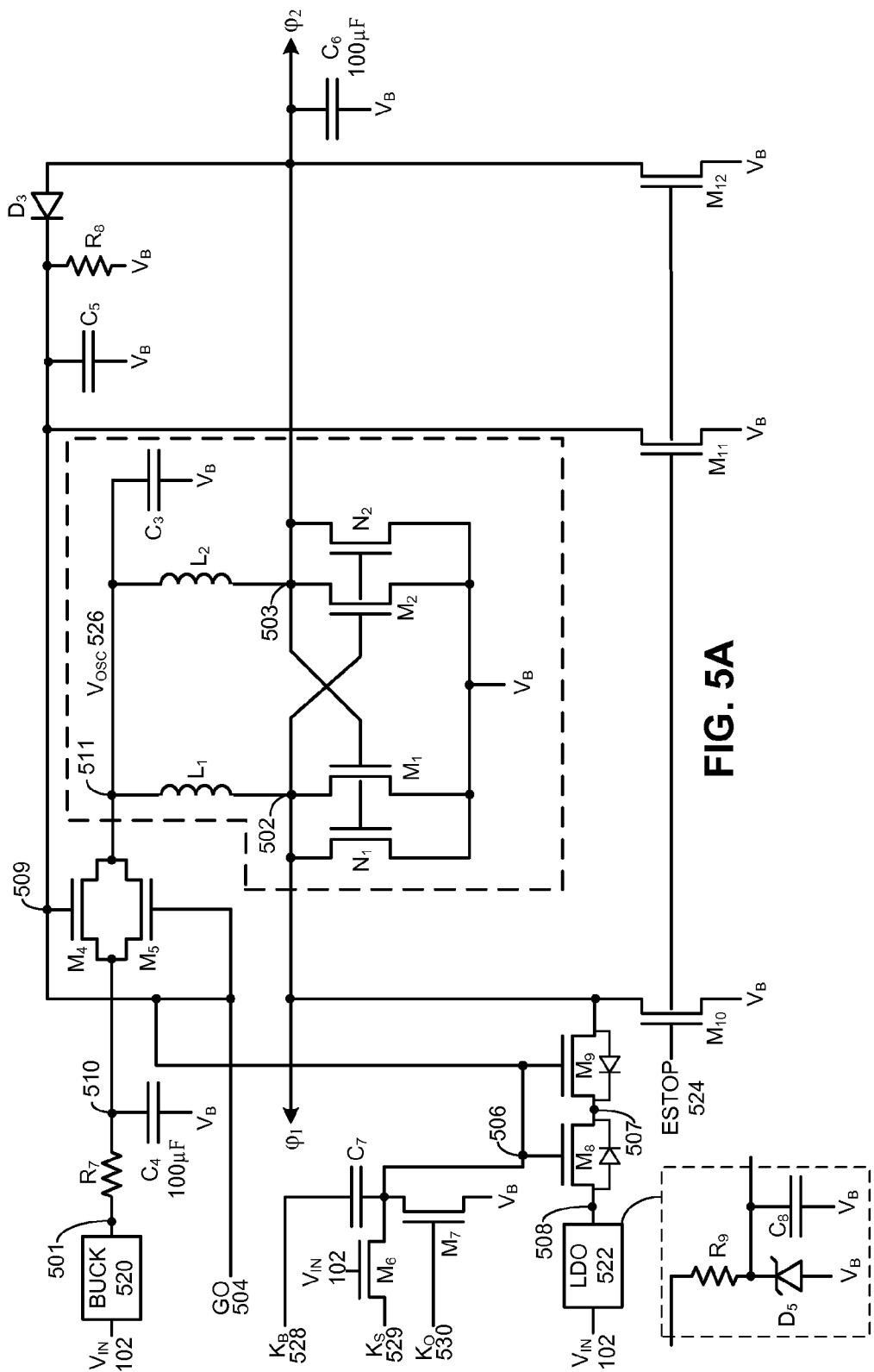
FIG. 5A illustrates yet another design for a resonant oscillator circuit in accordance with an embodiment of the present invention.
Figure 5B:
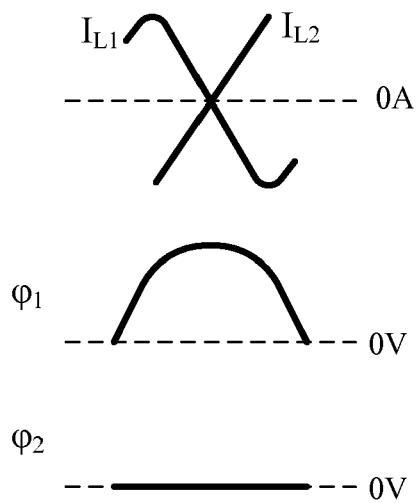
FIG. 5B illustrates currents and voltages for the resonant oscillator circuit in FIG. 5A in accordance with an embodiment of the present invention.

FIG. 5A provides a schematic illustrating another implementation in accordance with an embodiment of the present invention. Moreover, FIG. 5B shows the relationships between two inductor currents, $I_{L1}$ and $I_{L2}$, and the two clock outputs, ($\phi_1$ and $\phi_2$, in FIG. 5A. Note that at the halfway point of a clock phase, the inductor currents cross at zero while one clock phase is held low and the other is at its maximum amplitude. We can use this relationship between the two currents and voltage outputs to cleanly initiate oscillations in the blip circuit without first having to energize the inductors.

The overall idea is to simultaneously apply power to the two inductors while setting one clock output to its peak voltage amplitude, and then release the clock output and allow the oscillator to continue as normal. Note that a narrow pulse is applied to circuit node 506 simultaneously with turning on $M_1$ and $M_2$ with the GO signal 504. Moreover, circuit node 508 is tied to either a low drop-out voltage regulator (LDO) 522, or alternatively, a Zener-diode circuit that provides the initial voltage amplitude for the clock output (as is illustrated in the box with dashed lines). Because of the inherent body diode, two FETs, Mg and $M_9$, are required to isolate the full clock swing from the voltage source.

The ratio between the oscillator voltage $V_{OSC}$ 526 and the initial voltage at circuit node 502 is important for correct startup. In one embodiment, the oscillator is set to 0.5V and the output of the voltage source is set to be <<1.6V (LDO) or 1.8V (Zener). The microcontroller then ramps up the oscillator voltage under programmed control.

Figure 5C:
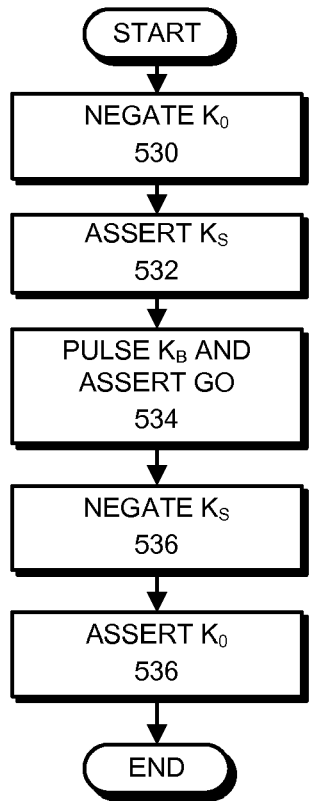
FIG. 5C presents a flow chart listing a sequence of operations for some of the inputs of the resonant oscillator circuit illustrated in FIG. 5A in accordance with an embodiment of the present invention.
Figure 5D:
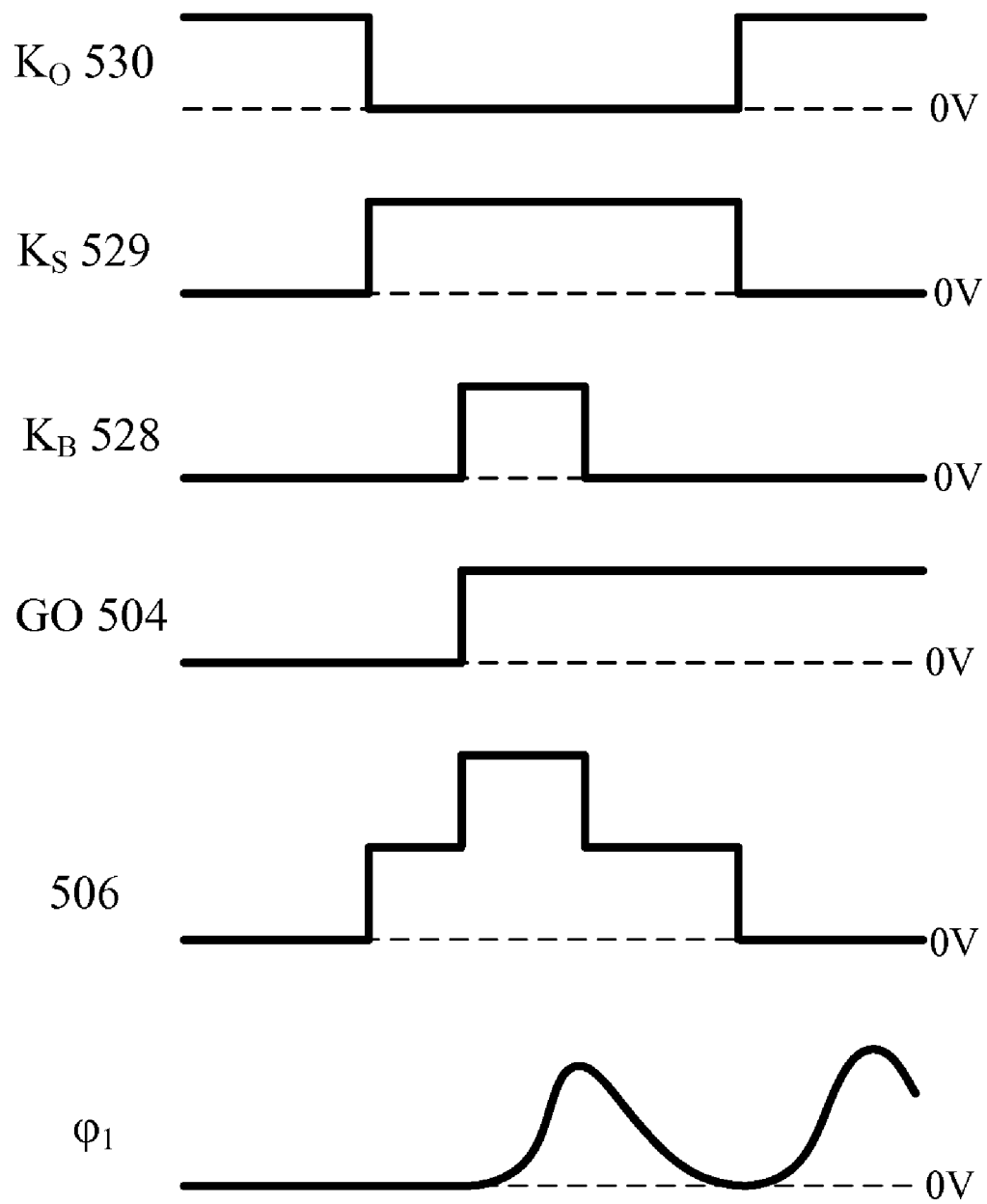
FIG. 5D presents a timing diagram for the resonant oscillator circuit illustrated in FIG. 5A in accordance with an embodiment of the present invention.

The timing between energizing circuit node 511 and circuit node 502 is also important. The microcontroller sequences the FETs that turn power on and off to the oscillator and set the clock output to its initial value. Note that the microcontroller may output only 2.5V, which may result in a slow rise time on the clock output. A bootstrap circuit enhances the clock-pulse voltage by driving circuit node 506 to a voltage substantially higher than the high output voltage of the microcontroller. Referring to the flow chart illustrated in FIG. 5C and the timing diagram in FIG. 5D, initially the signal $K_O$ 530 starts high and circuit node 506 starts low. Next, the microcontroller negates signal $K_O$ 530 (step 530) and asserts signal $K_S$ 529 (step 532) which charges up node 506 through an isolation n-type transistor $M_6$. Node 506 then charges up to $V_{IN}$ 102 minus one threshold drop. At the same time, capacitor $C_7$ is also charged up. The microcontroller then asserts signal $K_B$ 528 and simultaneously asserts GO signal 504 (step 534) which raises node 506 to a higher voltage. Next, the microcontroller reverses the sequence to end the pulse applied to circuit node 506. This involves negating signal $K_S$ 529 (step 536) and asserting signal $K_0$ 530 (step 536).

Note that FIG. 5A uses the same rectification circuit as the circuit illustrated in FIG. 4. Additionally, GO signal 504 and the bootstrapped voltage from circuit node 506 are ORed in via Schottky diodes. Additionally, a low-threshold FET, $M_5$, is tied directly to GO signal 504 to time applied power to the oscillator coincident with setting the clock output to its initial value.

Energizing Process

Figure 6:
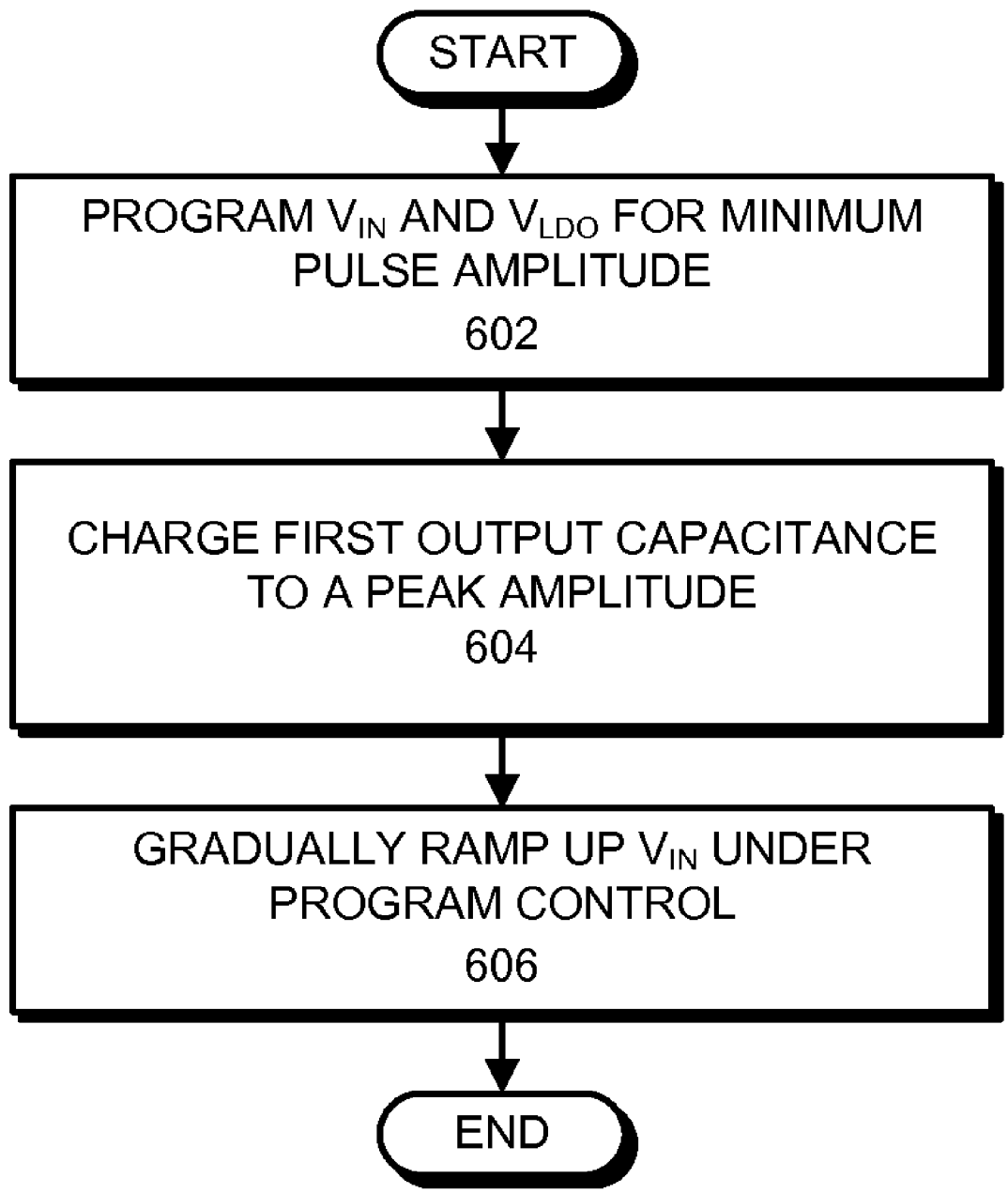
FIG. 6 presents a flow chart listing operations performed by the resonant oscillator circuit illustrated in FIG. 5A in accordance with an embodiment of the present invention.

FIG. 6 presents a flow chart listing operations performed while starting up the resonant oscillator circuit illustrated in FIG. 5A in accordance with an embodiment of the present invention. First, $V_{IN}$ 102 and $V_{LDO}$ from node 508 are programmed to provide a minimum peak pulse amplitude (step 602). Next, the system charges an output capacitor for the resonant oscillator to the peak amplitude (step 604). (This output capacitor is described in more detail with reference to the SCBs in U.S. patent application Ser. No. 12/535,974 which is discussed above.) Then, as oscillations subsequently commence, the system gradually ramps up $V_{IN}$ 102 under program control across multiple oscillation periods to provide SCB inrush protection during the startup process (step 606).

Figure 7:
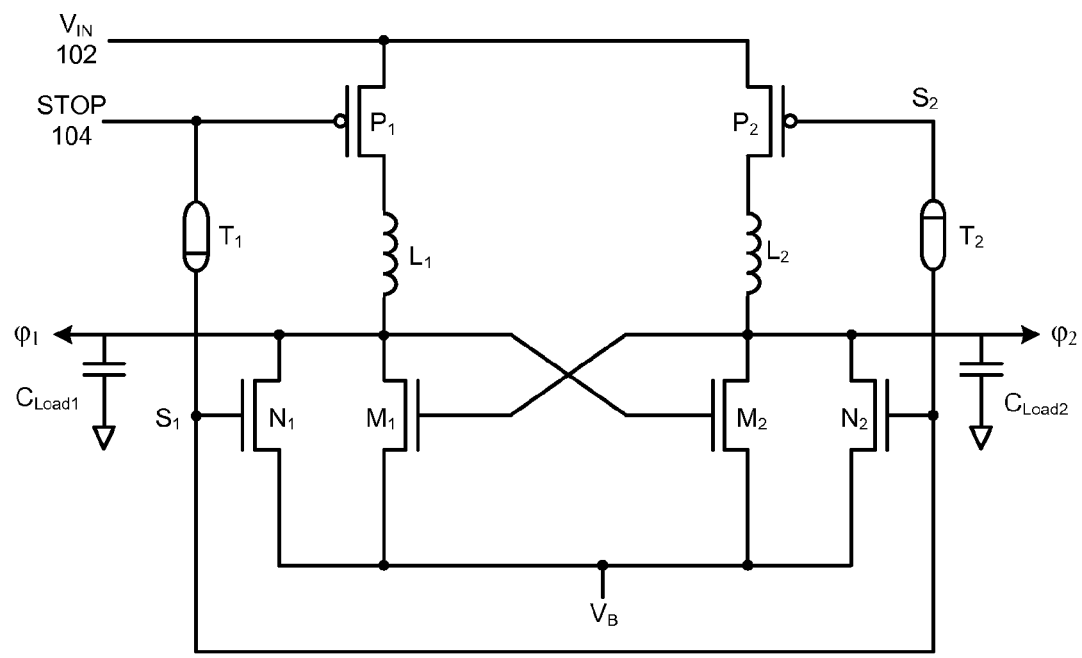
FIG. 7 illustrates a resonant oscillator circuit in accordance with an embodiment of the present invention.

FIG. 7 illustrates a resonant oscillator circuit in accordance with an embodiment of the present invention. More specifically, FIG. 7 illustrates a first capacitance and a second capacitance in a resonant oscillator circuit in accordance with an embodiment of the present invention. In the resonant oscillator circuit, the first inductor (L1) and the second inductor (L2) are configured to operate with the first and second capacitances, respectively, to produce resonant oscillations which appear at a first phase output ($\phi$1) and a second phase output ($\phi$2).

As can be seen in FIG. 7, the first capacitance includes capacitive components from a load on a first phase output of the resonant oscillator circuit ($C_{load1}$) and a gate terminal of a second n-type transistor ($M_2$), and the second capacitance includes capacitive components from a load on a second phase output of the resonant oscillator circuit ($C_{load2}$) and a gate terminal of a first n-type transistor ($M_1$).

Note that although FIG. 7 is presented as an example of the capacitances in the resonant oscillator circuit, in other embodiments different arrangements of circuit elements may be used in the resonant oscillator circuit. For example, although the resonant oscillator circuit of FIG. 1A is presented in FIG. 7, the resonant oscillator circuits shown in FIGS. 3-5A can include similar capacitances.

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A resonant oscillator circuit, comprising:
   a first inductor;
   a second inductor;
   a first capacitance;
   a second capacitance;
   wherein the first and second inductors are configured to operate with the first and second capacitances to produce resonant oscillations which appear at a first phase output and a second phase output; and
   a startup circuit configured to start the resonant oscillator circuit in a state where the first phase output is at a peak voltage, the second phase output is at a base voltage, and currents through the first and second inductors are substantially zero, so that oscillations commence without a significant startup transient.

2. The resonant oscillator of claim 1,
   wherein the first inductor includes a constant potential terminal coupled to an input voltage and a time-varying potential terminal coupled to the first phase output;
   wherein the second inductor includes a constant potential terminal coupled to the input voltage and a time-varying potential terminal coupled to the second phase output;
   wherein the resonant oscillator circuit also includes a first n-type transistor with a source terminal coupled to a base voltage, a drain terminal coupled to the first phase output, and a gate terminal coupled to the second phase output;
   wherein the resonant oscillator circuit additionally includes a second n-type transistor with a source terminal coupled to the base voltage, a drain terminal coupled to the second phase output, and a gate terminal coupled to the first phase output;
   wherein the first capacitance includes capacitive components from a load on the first phase output and the gate terminal of the second n-type transistor; and
   wherein the second capacitance includes capacitive components from a load on the second phase output and the gate terminal of the first n-type transistor.

3. The resonant oscillator circuit of claim 2, wherein the startup circuit is configured to initially charge the first capacitance so that first phase output is at the peak voltage prior to starting the resonant oscillator circuit.

4. The resonant oscillator circuit of claim 3, wherein the startup circuit is additionally configured to apply the input voltage to the constant-potential terminals of the first and second inductors prior to starting the resonant oscillator circuit.

5. The resonant oscillator circuit of claim 4, further comprising a buck converter configured to apply the input voltage to the constant-potential terminals of the first and second inductors.

6. The resonant oscillator circuit of claim 4, wherein the startup circuit includes a microcontroller, which sequences operations involved in applying the input voltage to the first and second inductors and in initially charging the first capacitance.

7. The resonant oscillator circuit of claim 6, wherein the startup circuit additionally includes a bootstrap circuit configured to produce a pulse voltage which is higher than the output voltage of the microcontroller, wherein the pulse voltage is used to control the initial charging of the first capacitance.

8. The resonant oscillator circuit of claim 1, further comprising an envelope-generation circuit coupled between the input voltage and the resonant oscillator circuit, wherein the envelope-generation circuit is configured to ramp up the input voltage across multiple oscillation periods when the resonant oscillator circuit starts up.

9. The resonant oscillator circuit of claim 2, wherein the startup circuit additionally comprises:
   a third n-type transistor with a source terminal coupled to a base voltage, a drain terminal coupled to the first phase output, and a gate terminal coupled to the second phase output; and
   a fourth n-type transistor with a source terminal coupled to the base voltage, a drain terminal coupled to the second phase output, and a gate terminal coupled to the first phase output;
   wherein the third and fourth n-type transistors have lower threshold voltages than the first and second n-type transistors, which allows oscillations to commence at lower input voltages.

10. A method for starting up a resonant oscillator circuit, wherein the resonant oscillator circuit includes a first inductor, a second inductor, a first capacitance, and a second capacitance, wherein the first and second inductors are configured to operate with the first and second capacitances to produce resonant oscillations which appear at a first phase output and a second phase output, the method comprising:
   performing one or more initialization operations so that the resonant oscillator circuit is in an initial state where the first phase output is at a peak voltage, the second phase output is at a base voltage, and currents through the first and second inductors are substantially zero; and
   allowing the resonant oscillator circuit to commence oscillations from the initial state without a significant startup transient.

11. The method of claim 10,
   wherein the first inductor includes a constant potential terminal coupled to an input voltage and a time-varying potential terminal coupled to the first phase output;
   wherein the second inductor includes a constant potential terminal coupled to the input voltage and a time-varying potential terminal coupled to the second phase output;
   wherein the resonant oscillator circuit also includes a first n-type transistor with a source terminal coupled to a base voltage, a drain terminal coupled to the first phase output, and a gate terminal coupled to the second phase output;
   wherein the resonant oscillator circuit additionally includes a second n-type transistor with a source terminal coupled to the base voltage, a drain terminal coupled to the second phase output, and a gate terminal coupled to the first phase output;
   wherein the first capacitance includes capacitive components from a load on the first phase output and the gate terminal of the second n-type transistor; and wherein the second capacitance includes capacitive components from a load on the second phase output and the gate terminal of the first n-type transistor.

12. The method of claim 10, wherein the one or more initialization operations include initially charging the first capacitance so that first phase output is at the peak voltage prior to commencing the oscillations.

13. The method of claim 11, wherein the one or more initialization operations include applying the input voltage to the constant-potential terminals of the first and second inductors prior to commencing the oscillations.

14. The method of claim 12, wherein the one or more initialization operations are controlled by a microcontroller, which sequences operations involved in applying the input voltage to the first and second inductors and in initially charging the first capacitance.

15. The method of claim 10, wherein the method further comprises ramping up an input voltage for the resonant oscillator circuit across multiple oscillation periods to provide FET inrush protection while commencing oscillations in the resonant oscillator circuit.

16. A resonant oscillator circuit, comprising:
   a first inductor with a constant potential terminal coupled to an input voltage and a time-varying potential terminal coupled to a first phase output;
   a second inductor with a constant potential terminal coupled to the input voltage and a time-varying potential terminal coupled to a second phase output;
   a first n-type transistor with a source terminal coupled to a base voltage, a drain terminal coupled to the first phase output, and a gate terminal coupled to the second phase output;
   a second n-type transistor with a source terminal coupled to the base voltage, a drain terminal coupled to the second phase output, and a gate terminal coupled to the first phase output;
   a first capacitance, which includes capacitive components from a load on the first phase output and the gate terminal of the second n-type transistor;
   a second capacitance, which includes capacitive components from a load on the second phase output and the gate terminal of the first n-type transistor; and
   a startup circuit configured to start the resonant oscillator circuit in a state where the first phase output is at a peak voltage, the second phase output is at a base voltage, and currents through the first and second inductors are substantially zero, so that oscillations commence without a significant startup transient.

17. The resonant oscillator circuit of claim 16, wherein the startup circuit is configured to initially charge the first capacitance so that first phase output is at the peak voltage prior to starting the resonant oscillator circuit.

18. The resonant oscillator circuit of claim 17, wherein the startup circuit is additionally configured to apply the input voltage to the constant-potential terminals of the first and second inductors prior to starting the resonant oscillator circuit.

19. The resonant oscillator circuit of claim 18, further comprising a buck converter configured to apply the input voltage to the constant-potential terminals of the first and second inductors.

20. The resonant oscillator circuit of claim 18, wherein the startup circuit includes a microcontroller, which sequences operations involved in applying the input voltage to the first and second inductors and in initially charging the first capacitance.

21. The resonant oscillator circuit of claim 20, wherein the startup circuit additionally includes a bootstrap circuit configured to produce a pulse voltage which is higher than the output voltage of the microcontroller, wherein the pulse voltage is used to control the initial charging of the first capacitance.

22. The resonant oscillator circuit of claim 16, further comprising an envelope-generation circuit coupled between the input voltage and the resonant oscillator circuit, wherein the envelope-generation circuit is configured to ramp up the input voltage across multiple oscillation periods when the resonant oscillator circuit starts up.

23. The resonant oscillator circuit of claim 16, wherein the startup circuit additionally comprises:
   a third n-type transistor with a source terminal coupled to a base voltage, a drain terminal coupled to the first phase output, and a gate terminal coupled to the second phase output; and
   a fourth n-type transistor with a source terminal coupled to the base voltage, a drain terminal coupled to the second phase output, and a gate terminal coupled to the first phase output;
      wherein the third and fourth n-type transistors have lower threshold voltages than the first and second n-type transistors, which allows oscillations to commence at lower input voltages.

* * * * *